(12) United States Patent
Pereira

(10) Patent No.: US 7,219,188 B1
(45) Date of Patent: May 15, 2007

(54) SEGMENTED CONTENT ADDRESSABLE MEMORY ARRAY AND PRIORITY ENCODER

(75) Inventor: Jose P Pereira, Cupertino, CA (US)

(73) Assignee: NetLogic Microsystems, Inc., Mountain View, CA (US)

(*) Notice: Subject to any disclaimer, the term of this patent is extended or adjusted under 35 U.S.C. 154(b) by 343 days.

(21) Appl. No.: 10/773,591

(22) Filed: Feb. 6, 2004

(51) Int. Cl.
*G06F 12/06* (2006.01)

(52) U.S. Cl. .................................................. 711/108

(58) Field of Classification Search .................... None
See application file for complete search history.

(56) References Cited

U.S. PATENT DOCUMENTS

| | | | |
|---|---|---|---|
| 5,649,149 A * | 7/1997 | Stormon et al. ............ 711/108 |
| 6,389,507 B1 * | 5/2002 | Sherman ..................... 711/108 |
| 6,937,491 B2 * | 8/2005 | Park et al. ..................... 365/49 |
| 2002/0129198 A1 * | 9/2002 | Nataraj et al. .............. 711/108 |
| 2004/0030803 A1 * | 2/2004 | Eatherton et al. .......... 709/245 |
| 2005/0138279 A1 * | 6/2005 | Somasundaram ........... 711/108 |

* cited by examiner

*Primary Examiner*—B. James Peikari
(74) *Attorney, Agent, or Firm*—William L. Paradice, III

(57) ABSTRACT

A CAM includes a plurality of CAM blocks, each including an array of CAM cells divided into a plurality of segments, each array segment for storing a number of data values that are assigned the same priority, a plurality of block priority circuits, each having inputs to receive match signals from a corresponding CAM block and having outputs to generate a block index and priority of a matching data value in the corresponding CAM block assigned the highest priority, and a global priority and index circuit having inputs to receive the block indexes and associated priorities from the block priority circuits, and having an output to generate a device index and associated priority of the highest priority matching value.

41 Claims, 11 Drawing Sheets

SEGMENTED CONTENT ADDRESSABLE MEMORY ARRAY AND PRIORITY ENCODER

FIELD OF INVENTION

This invention relates generally to semiconductor memories and specifically to content addressable memories.

DESCRIPTION OF RELATED ART

Content addressable memories (CAMs) are frequently used for address look-up functions in Internet data routing. For example, routers used by local Internet Service Providers (ISPs) typically include one or more CAMs for storing a plurality of Internet addresses and associated data such as, for instance, corresponding address routing information. When data is routed to a destination address, the destination address is compared with all CAM words, e.g., Internet addresses, stored in the CAM. If there is a match, routing information corresponding to the matching CAM word is output and thereafter used to route the data.

A CAM device includes a CAM array having a plurality of memory cells arranged in an array of rows and columns, with each row storing a CAM word (e.g., a destination or forwarding address). During compare operations, a search key (sometimes called a comparand word) is provided to the CAM device and compared with all the CAM words stored in the array. For each CAM word that matches the search key, a corresponding match line is asserted to indicate the match result. If any of the match lines are asserted, a match flag is asserted to indicate the match condition, and a priority encoder determines the index of the highest priority matching (HPM) entry in the CAM array. The HPM index may be used to access associative data stored in an associated memory such as, for example, a RAM device.

Sometimes a single CAM device is partitioned into multiple blocks that each includes its own array of CAM cells. Typically, all CAM blocks participate in compare operations with the search key, which can result in significant power consumption. It would be desirable to limit a search to only those entries associated with a particular range of data values to reduce power consumption during such compare operations. In addition, it would be desirable to assign priorities to each of the data values stored in the CAM device, and to be able to store data values having the same priority together in corresponding segments of the one or more arrays in a manner that optimizes the storage capacity of the CAM device.

BRIEF DESCRIPTION OF THE DRAWINGS

Like reference numerals refer to corresponding parts throughout the drawing figures.

DETAILED DESCRIPTION

A method and apparatus for segmenting a CAM array in more or more CAM blocks according to priority are discussed below in the context of a CAM device 100 for simplicity only. It is to be understood that embodiments of the present invention are equally applicable to CAM structures having other configurations. Further, architectural configurations of the present invention may be implemented in other types of memory blocks such as, for instance, RAM, Flash, and EEPROM. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Embodiments of the present invention reduce the power consumption of CAM devices during compare operations between a search key and data values stored therein by selectively enabling only those CAM blocks that store a predetermined range of data values. For some embodiments, the CAM device is partitioned into a plurality of CAM blocks, with each CAM block storing only data values that fall within a corresponding predetermined range of values to participate in the compare operation. During compare operations between the search key and the data values stored in the CAM device, a portion of the search key is extracted and compared with the predetermined data ranges corresponding to the CAM blocks. If the selected search key portion falls within the predetermined range for a particular CAM block, the CAM block is enabled and allowed to participate in the compare operation with the search key. If the selected search key portion does not fall within the predetermined range, the CAM block is disabled and prevented from participating in the compare operation. Thus, by enabling only the CAM block(s) that store certain ranges of data values, power consumption can be reduced versus performing compare operations in all CAM blocks in the CAM device.

Figure 1:
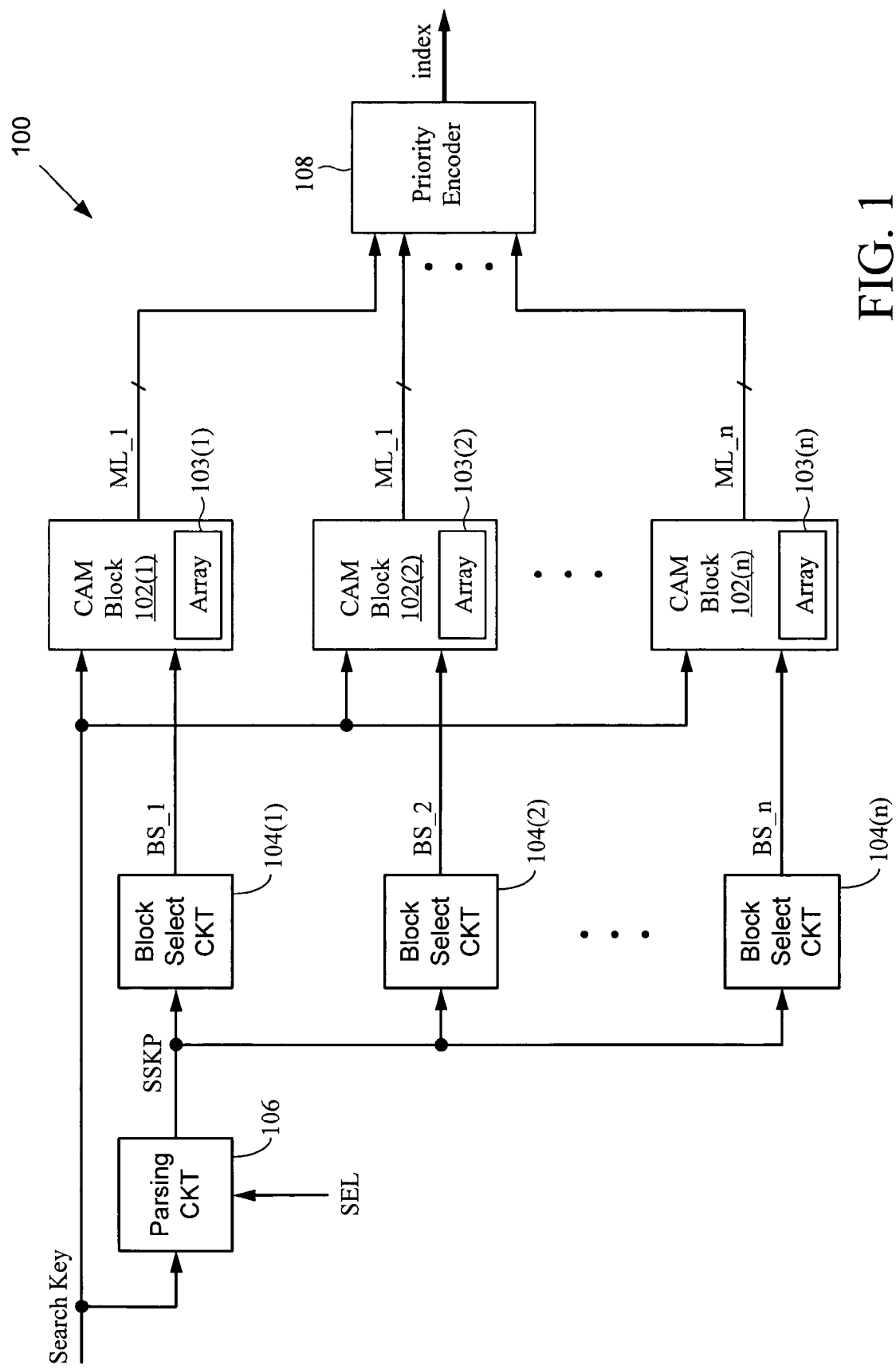
FIG. 1 is a block diagram of a CAM device including a plurality of CAM blocks in accordance with one embodiment of the present invention.

FIG. 1 shows a CAM device 100 in accordance with one embodiment of the present invention as having a number of CAM blocks 102(1)–102(n), a corresponding number of block select circuits 104(1)–104(n), a parsing circuit 106, and a priority encoder 108. Each CAM block 102 includes an array 103 of CAM cells (not shown in FIG. 1 for simplicity) for storing a plurality of data values. For some embodiments, each array 103 is assigned a range of data values, and stores only data values that fall within its assigned range. For some embodiments, each array 103 is assigned a unique range of data values. For other embodiments, arrays 103 can be assigned overlapping data ranges.

Arrays 103 can include any suitable type of CAM cell such as, for example, synchronous CAM cells, asynchronous CAM cells, binary CAM cells, ternary CAM cells, and quaternary CAM cells. Further, each array 103 can be of any suitable size and/or configuration, and in some embodiments may be of different sizes and/or configurations. For example, in one embodiment, a first number of arrays 103 can be configured as 1×144 CAM arrays, while a second number of arrays 103 can be configured as 2×72 CAM arrays. One or more instructions and related control signals can be provided to CAM device 100 from an instruction decoder (not shown for simplicity) to control read, write, and compare operations for CAM device 100. Other well-known signals that can be provided to CAM device 100, such as enable signals, reset signals, and clock signals, are not shown for simplicity.

Each CAM block 102 has a first input to receive a search key, a second input to receive a block select signal BS from a corresponding block select circuit 104, and outputs connected to priority encoder 108 via corresponding match lines ML (for simplicity the match lines are represented collectively in FIG. 1). The search key can be compared with CAM words stored in one or more CAM blocks 102(1)–102(n) selectively enabled by the block select signals BS_1 to BS_n. The match lines ML provide match results for compare operations to priority encoder 108, which determines the matching entry that has the highest priority number associated with it and generates the index or address of this highest priority match (HPM). If there are multiple matching entries, priority encoder 108 determines the HPM address based on which matching entry is stored in the lowest numerical address of CAM device 100. For alternative embodiments, priority encoder 108 may determine the HPM address based on entries stored in other predetermined arrangements (e.g., at the highest numerical address).

For purposes of discussion herein, the first CAM block 102(1) in CAM device 100 is designated as the highest priority block, the second CAM block 102(2) is designated as the next highest priority block, and so on, and the last CAM block 102(n) is designated as the lowest priority block, although in actual embodiments priority may be reversed or otherwise modified. Thus, the highest priority CAM block 102(1) may include the lowest physical CAM addresses (i.e., CAM addresses 0 to k−1), the next highest priority block 102(2) may include the next lowest physical CAM addresses (i.e., CAM addresses k to 2k−1), and so on, and the lowest priority CAM block 102(n) may include the highest CAM addresses (i.e., CAM addresses (n−1)k to nk−1).

Parsing circuit 106 has a first input to receive the search key, a second input to receive a select signal SEL, and an output connected to the inputs of block select circuits 104(1)–104(n). Parsing circuit 106 may be any parsing circuit that extracts a portion (e.g., a selected number of bits) of the search key in response to SEL, and outputs the selected search key portion (SSKP) to the inputs of block select circuits 104(1)–104(n). Thus, SEL determines which bits of the search key are extracted to generate SSKP. For some embodiments, SEL selects a predetermined number of the most significant bits (MSBs) of the search key to generate SSKP. For other embodiments, other portions of the search key can be extracted to generate SSKP in response to SEL.

SEL can be generated in any suitable manner. For some embodiments, SEL is a user-generated signal that can be provided to parsing circuit 106 as part of an instruction to CAM device 100. For other embodiments, SEL can be eliminated, and parsing circuit 106 can be configured to extract a predetermined portion of the search key as SSKP.

The block select circuits 104(1)–104(n) control whether corresponding CAM blocks 102(1)–102(n) participate in compare operations between the search key and data values stored in corresponding CAM arrays 103(1)–103(n). More specifically, each block select circuit 104 determines whether SSKP falls within the range of data values assigned to the corresponding CAM array 103, and in response thereto generates the block select signal BS. For example, if SSKP falls within the range of data values assigned to CAM block 102(1), then block select circuit 104(1) asserts (e.g., to logic high) BS_1 to enable CAM block 102(1) for a compare operation between the search key and data stored in array 103(1). Conversely, if SSKP does not fall within the range of data values contained within CAM block 102(1), then block select circuit 104(1) de-asserts (e.g., to logic low) BS_1 to disable CAM block 102(1) for the compare operation.

Figure 2A:
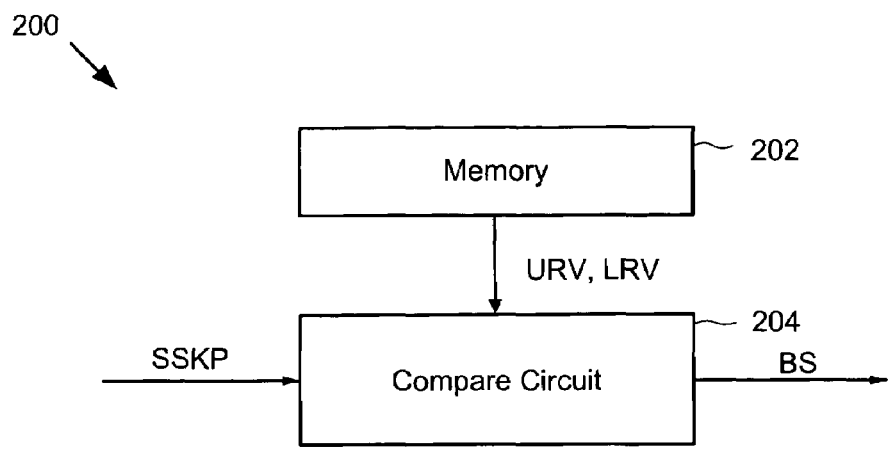
FIG. 2A is a block diagram of one embodiment of the block select circuit of FIG. 1.

FIG. 2A shows a block select circuit 200 that is one embodiment of block select circuit 104 of FIG. 1. Block select circuit 200 includes a memory element 202 and a compare circuit 204. Memory element 202, which can be any suitable type of memory element such as SRAM, DRAM, EPROM, EEPROM, flash memory, register, latch, or a CAM, stores a lower range value (LRV) and an upper range value (URV) for a corresponding CAM block 102, wherein LRV and URV are indicative of the range of data values that can be stored in a corresponding CAM block array 103. Compare circuit 204 includes a first input to receive SSKP from parsing circuit 106, a second input coupled to memory element 202, and an output to provide the block select signal BS to the corresponding CAM block 102. Compare circuit 204, which can be any suitable compare circuit, determines whether SSKP falls between LRV and URV and generates BS accordingly. For example, if LRV≦SSKP≦URV, compare circuit 204 asserts BS to logic high. Conversely, if SSKP<LRV or if SSKP>URV, then compare circuit 204 de-asserts BS to logic low. For another embodiment, compare circuit 204 determines whether SSKP falls outside the range defined by LRV and URV and generates BS accordingly. For yet another embodiment, compare circuit 204 determines whether SSKP is within the range defined by LRV and URV, but which does not include LRV and/or URV. For other embodiments, compare circuit 204 determines whether SSKP is either greater than, greater than or equal to, less than, or less than or equal to only one of LRV or URV.

Figure 2B:
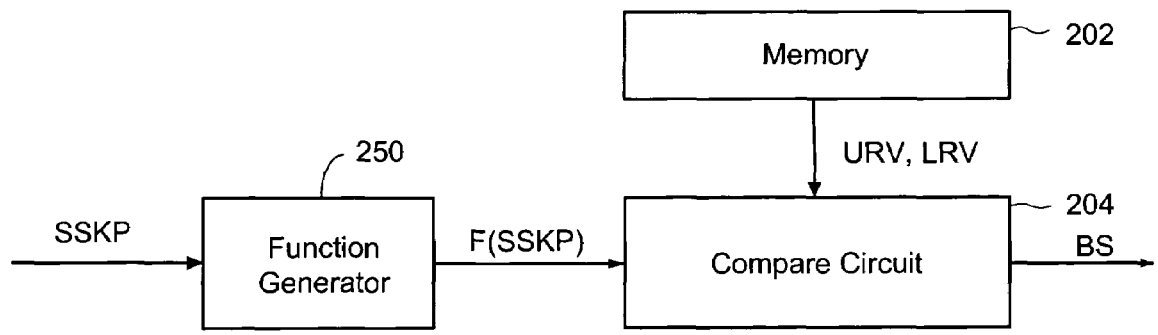
FIG. 2B is a block diagram of a function generator that can be used within some embodiments of the block select circuit of FIG. 2A.

FIG. 2B is a block diagram of a function generator 250 that can be used with some embodiments of block select circuit 200 of FIG. 2A. Function generator 250 includes an input to receive SSKP and an output to generate a logical function F(SSKP) of SSKP. Function generator 250 can be any suitable function generator that performs a logical function on SSKP to generate F(SSKP). For example, function generator 250 can perform a hashing function on SSKP to generate F(SSKP), although other suitable logic functions can be performed. For some embodiments, function generator 250 performs a logical function on the entire SSKP value. For other embodiments, function generator 250 performs a logical function on a selected portion of SSKP. Once generated by function generator 250, F(SSKP) is provided to compare circuit 204 which, in turn, determines whether F(SSKP) falls within the range indicated by URV and LRV and then generates the block select signal BS accordingly. For other embodiments, function generator 250 can be included as part of parsing circuit 106.

Figure 3:
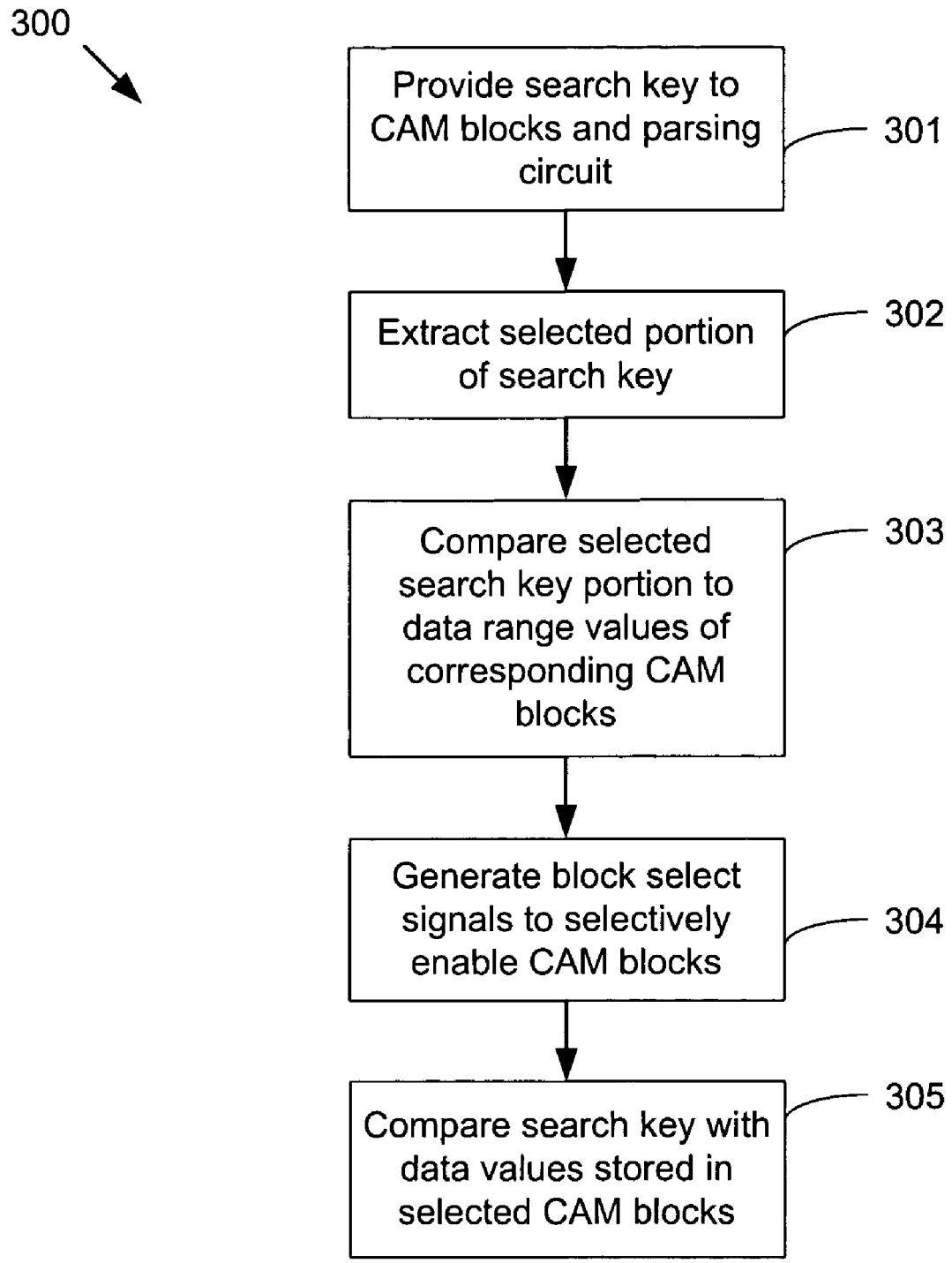
FIG. 3 is a flow chart illustrating an exemplary compare operation for one embodiment of FIG. 1.

An exemplary operation of CAM device 100 is described below with respect to the flow chart of FIG. 3. During a compare operation, the search key is provided to each CAM block 102 and to parsing circuit 106 (301). Parsing circuit 106 uses SEL to extract a selected portion of the search key SSKP (302), and outputs SSKP to the block select circuits 104(1)–104(n). Each block select circuit 104/200 compares SSKP with the LRV and with the URV to determine whether SSKP falls within the predetermined range of data values stored in the corresponding CAM block 102 (303), and in response thereto generates the block select signal BS to selectively enable the corresponding CAM block 102 (304). Then, the search key is compared with the data values stored in the enabled CAM blocks to generate match results in a well-known manner (305).

For some embodiments, the block select circuit 104/200 enables its corresponding CAM block 102 to participate in the compare operation if SSKP falls between LRV and URV and, conversely, disables the corresponding CAM block 102 if SSKP does not falls between LRV and URV. For one embodiment, when disabled, the unselected CAM blocks 102 do not drive the search key into their respective CAM arrays 103 for the compare operation, thereby precluding comparison with data that does not fall within a predetermined content range. Since the search key is not compared with data stored in the disabled CAM blocks 102, the disabled CAM blocks 102 consume much less power during the compare operation than do the selected and enabled CAM block(s). In this manner, present embodiments not only restrict compare operations to data that falls within a selected data range, but also minimize power consumption of the unselected CAM block(s) during compare operations. Each CAM block may have associated therewith a block match flag circuit that receives the match results on the match lines of the corresponding CAM block and which outputs a block match flag that is used to determine which block has the highest priority matching result. When the block select circuit for a given CAM block disables the CAM block from comparisons, it may also cause the block match flag circuit to output a mismatch for the entire CAM block such that even though match states will be identified on the match lines of the disabled CAM block, these match results will not factor in determining the highest priority matching entry for the entire CAM device. For another embodiment, the block select circuit disables the match lines from generating a match result (e.g., forcing a mismatch) or otherwise generating a mismatch state for all match lines of the affected block to the priority encoder and/or match flag logic that receives the match lines from the affected block.

The ability to selectively enable or disable one or more CAM blocks from participating in compare operations may be especially useful for combining routing look-up functions for different networks in a single device 100. For example, in one embodiment, routing information corresponding to a first virtual private network (VPN) and falling within a first range of data values (e.g., forwarding addresses 0–100) may be stored in a first CAM block 102(1), routing information corresponding to a second VPN and falling within a second range of data values (e.g., forwarding addresses 101–200) may be stored in a second CAM block 102(2), routing information corresponding to a web search and falling within a third range of data values (e.g., forwarding addresses 201–300) may be stored in a third block 102(3), and routing information corresponding to a local area network (LAN) and falling within a fourth range of data values (e.g., forwarding addresses) may be stored in a fourth CAM block 102 (4). During compare operations, the search key corresponding to routing functions of one of these four networks may be exclusively compared with data stored in the corresponding CAM block(s) by extracting SSKP from the search key and determining which CAM block(s) stores data values that includes SSKP.

Figure 4:
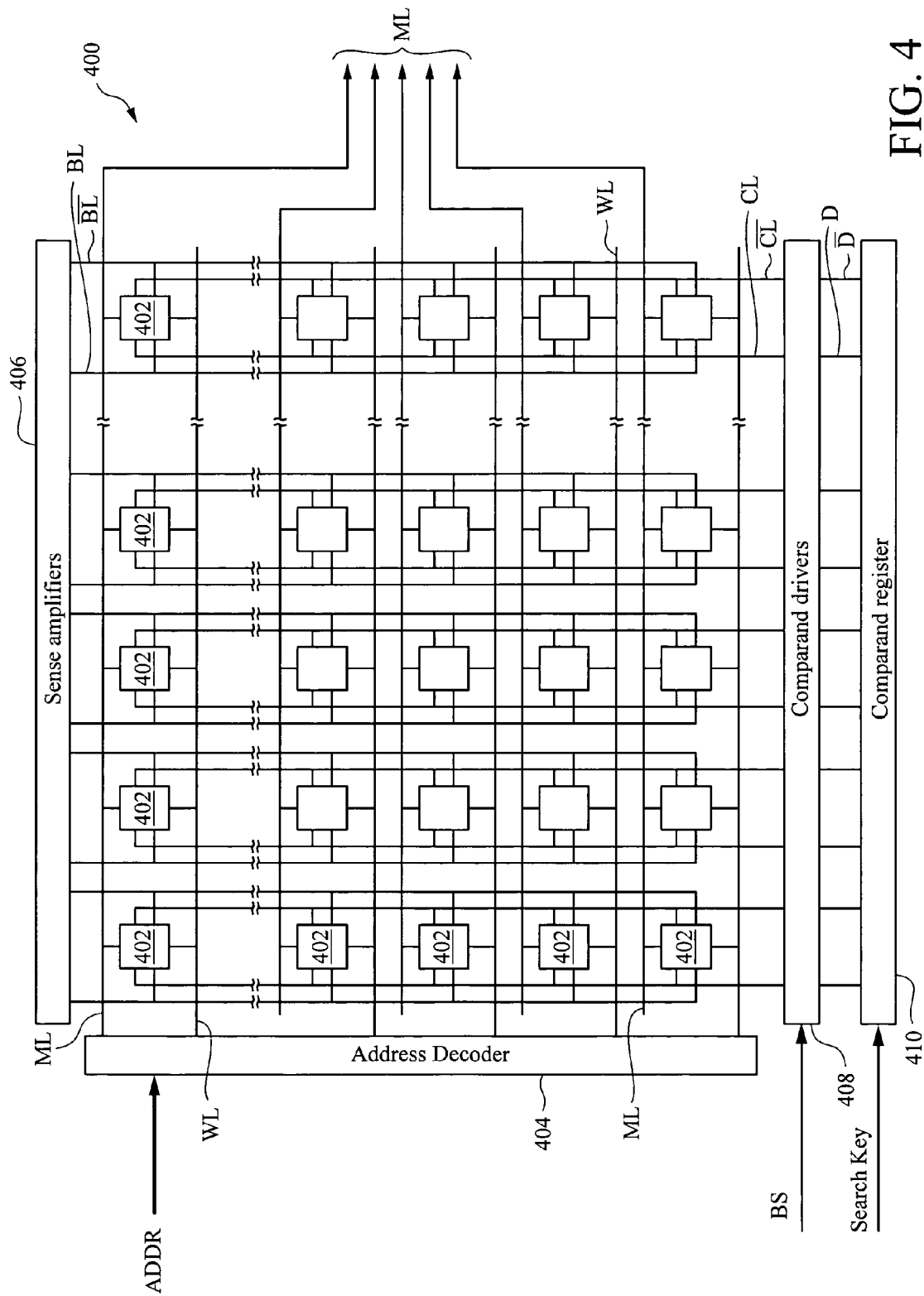
FIG. 4 is a block diagram of one embodiment of the CAM block of FIG. 1.

FIG. 4 shows a CAM array 400 that is one embodiment of CAM array 103 of FIG. 1. Array 400 includes a plurality of CAM cells 402 organized in any number of rows and columns. Each row of CAM cells 402 is coupled to a match line ML and to a word line WL. Each word line WL is driven by an address decoder 404 to select one or more of CAM cells 402 for writing or reading. For alternative embodiments, multiple CAM blocks may share an address decoder. Each match line ML provides the match results of a compare operation to the priority encoder 108 (see also FIG. 1). A match line ML indicates a match condition for the row only if all CAM cells 402 in that row match the search key. Each CAM cell 402 may be a binary, ternary, quaternary, SRAM-based or DRAM-based CAM cell. In some embodiments, the match line ML is pre-charged for the compare operation. If any CAM cell 402 in the row does not match the search key, the CAM cell(s) 402 discharges the match line ML toward ground potential (e.g., logic low). Conversely, if all CAM cells 402 match the search key, the match line ML remains in a charged state (e.g., logic high). When the CAM block 102 is disabled in response to the block select signal BS, the search key is not driven into the array 400, and the match lines ML may remain in their charged state during the compare operation, regardless if there is a mismatch. The match lines need not be pre-charged for a subsequent compare operation. The ability to maintain the match lines of unselected CAM blocks in their charged state during the compare operation can reduce power consumption of present embodiments over prior art architectures.

Each row of array 400 can also include one or more valid bits indicative of whether a valid CAM word is stored in the row. The valid bits can be used in a well-known manner to generate a full flag and/or a next free address for the CAM block 102.

Each column of CAM cells 402 is coupled to a bit line BL, a complementary bit line $\overline{BL}$, a comparand line CL, and a complementary comparand line $\overline{CL}$. The bit lines BL and $\overline{BL}$ are coupled to sense amplifiers 406 that can enable data to be written to or read from a row of CAM cells 402. The comparand lines CL and $\overline{CL}$ are coupled to comparand drivers 408, which in turn are coupled to a comparand register 410 via complementary data lines D and $\overline{D}$. The comparand drivers 408 selectively drive a search key received from the comparand register 410 via complementary data lines D and $\overline{D}$ onto complementary comparand lines CL and $\overline{CL}$ for comparison with data in CAM cells 402 in response the block select signal BS provided by the block select circuit 104. For some embodiments, the comparand register 410 can be shared by all CAM blocks 102(1)–102(n).

For alternate embodiments, other CAM array architectures can be used. For example, in some embodiments, CAM array 400 may not include complementary comparand lines CL and $\overline{CL}$, in which case the complementary bit lines BL and $\overline{BL}$ may be coupled to the comparand drivers 408 and be used to perform a compare operation as is generally known in the art. For example, in the first part of a compare cycle, compare data may be selectively driven onto BL and $\overline{BL}$, and during the second part of the compare cycle, BL and $\overline{BL}$ may be driven with data to be output from CAM array 400. For other embodiments, only one of comparand lines CL and $\overline{CL}$ or bit lines BL and $\overline{BL}$ may be needed.

Figure 5:
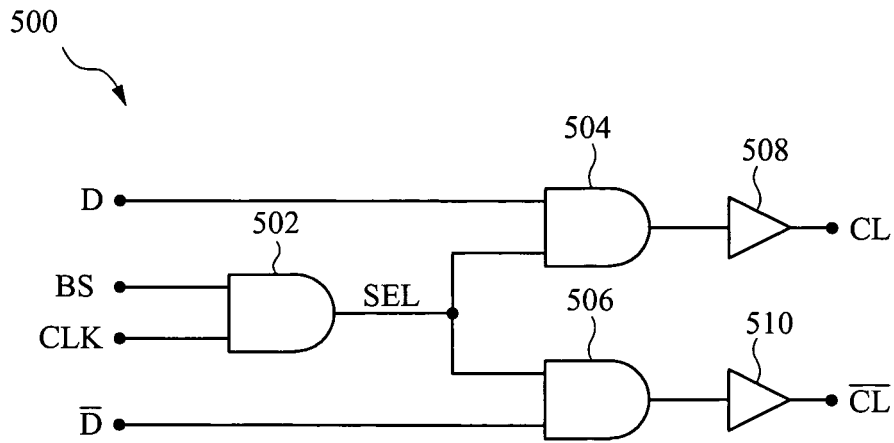
FIG. 5 is a logic diagram of one embodiment of a comparand driver of the CAM block of FIG. 4.

FIG. 5 shows a 1-bit comparand driver 500 that can be used in one embodiment of the comparand drivers 408. Driver 500 includes AND gates 502, 504, and 506, and also includes buffers 508 and 510. AND gate 502 includes input terminals to receive a clock signal CLK and the block select signal BS, and an output terminal coupled to first input terminals of AND gates 504 and 506. AND gate 504 includes a second input terminal coupled to the data line D, and an output terminal coupled to the buffer 508, which in turn drives the comparand line CL. AND gate 506 includes a second input terminal coupled to the complementary data line $\overline{D}$, and an output terminal coupled to the buffer 510, which in turn drives the complementary comparand line $\overline{CL}$. Buffers 508 and 510 can be any suitable buffers to drive comparand data onto the comparand lines CL and $\overline{CL}$. A plurality of drivers 500 can share AND gate 502.

During a compare operation, a comparand bit is provided to AND gate 504 via data line D, and a complementary comparand bit is provided to AND gate 506 via complementary data line $\overline{D}$. When CLK is logic high, the block select signal BS propagates through AND gate 502 to AND gates 504 and 506. If BS is asserted to logic high, AND gate 506 passes the comparand bit to buffer 508, which in turn drives the comparand bit onto the comparand line CL. Similarly, AND gate 508 passes the complementary comparand bit to buffer 510, which in turn drives the complementary comparand bit onto the complementary comparand line $\overline{CL}$. Thus, when the block select signal BS is asserted, comparand driver 500 drives the comparand lines CL and $\overline{CL}$ with the data received from the comparand register 210 via data lines D and $\overline{D}$.

Conversely, if BS is de-asserted to logic low to indicate that the corresponding CAM block 102 is not to participate in the compare operation, AND gates 506 and 508 force their respective output terminals to logic low. In response thereto, buffers 508 and 510 force the comparand line CL and the complementary comparand line $\overline{CL}$, respectively, to logic low. In this manner, when BS is de-asserted, comparand driver 500 does not drive complementary comparand data onto the comparand lines CL and $\overline{CL}$, thereby precluding the corresponding CAM block 102 from participating in the compare operation and thereby minimizing power consumption in the CAM device.

Embodiments of the present invention can be used in CAM devices that store data values that are assigned different priorities. For example, for networks that use the Classless Inter-Domain Routing (CIDR) addressing scheme, which as known in the art allows for a floating boundary between the Network and Host fields of destination addresses, the priority of a data value corresponds to a CIDR prefix value indicating which bits of the data value are to be masked during compare operations with the search key. Typically, CIDR addresses are stored in the CAM device according to priority so that the highest priority data values (e.g., the data values having the lowest prefix value) are stored in the lowest physical addresses of the CAM array and the lowest priority data values (e.g., the data values having the highest prefix value) are stored in the highest physical addresses of the CAM array. During compare operations between the search key and the CIDR entries, a conventional priority encoder generates the index of the highest-priority match, which is also the longest prefix match because the data values are ordered according to priority (prefix length).

Because the priority encoder determines the highest priority matching location based on predetermined address assignments, the ordering of data values in the CAM device must be maintained to generate the correct match results. The prioritizing of the data values is typically performed by a table management hardware and/or software tool. Thus, when a new data value is written to the CAM array, the table management tool must re-order some or all the data entries to maintain proper priority ordering. The re-ordering of entries in the CAM device can add significant overhead and can limit performance.

To eliminate the need for the table management tool, some prior CAM devices include a CAM array that is divided into a plurality of segments each for storing data values having the same priority, where each array segment is oversized to include extra storage locations that can be subsequently used to store new entries. In this manner, new entries can be stored in the segmented array without having to re-order existing entries. However, providing extra storage locations in each array segment can result in less than optimal utilization of the storage capacity of the CAM device.

As explained in detail below, the embodiments described above can be modified to store data values having different assigned priorities in a manner that more effectively utilizes the storage capacity of a CAM device than prior techniques. For some embodiments, a CAM device includes a number of regular CAM blocks and an overflow CAM block. The arrays of the regular CAM block are divided into a number of segments each for storing data values assigned the same priority, where each CAM block stores data values within a predetermined content range. The array segments of the regular CAM blocks can be sized (e.g., by a user) so that there are no extra storage locations available after an initial set of data values are stored therein, thereby maximizing the storage capacity of the regular CAM blocks. One or more overflow CAM blocks are provided to store new entries so that the data values initially stored in the regular CAM blocks do not have to be re-ordered. The array of the overflow CAM block can also be divided into a number of array segments each for storing data values assigned the same priority. For some embodiments, the overflow CAM block is assigned a content range that includes the content ranges of all the regular CAM blocks. For other embodiments, the regular CAM blocks and the overflow CAM blocks are not assigned any content ranges.

Figure 6:
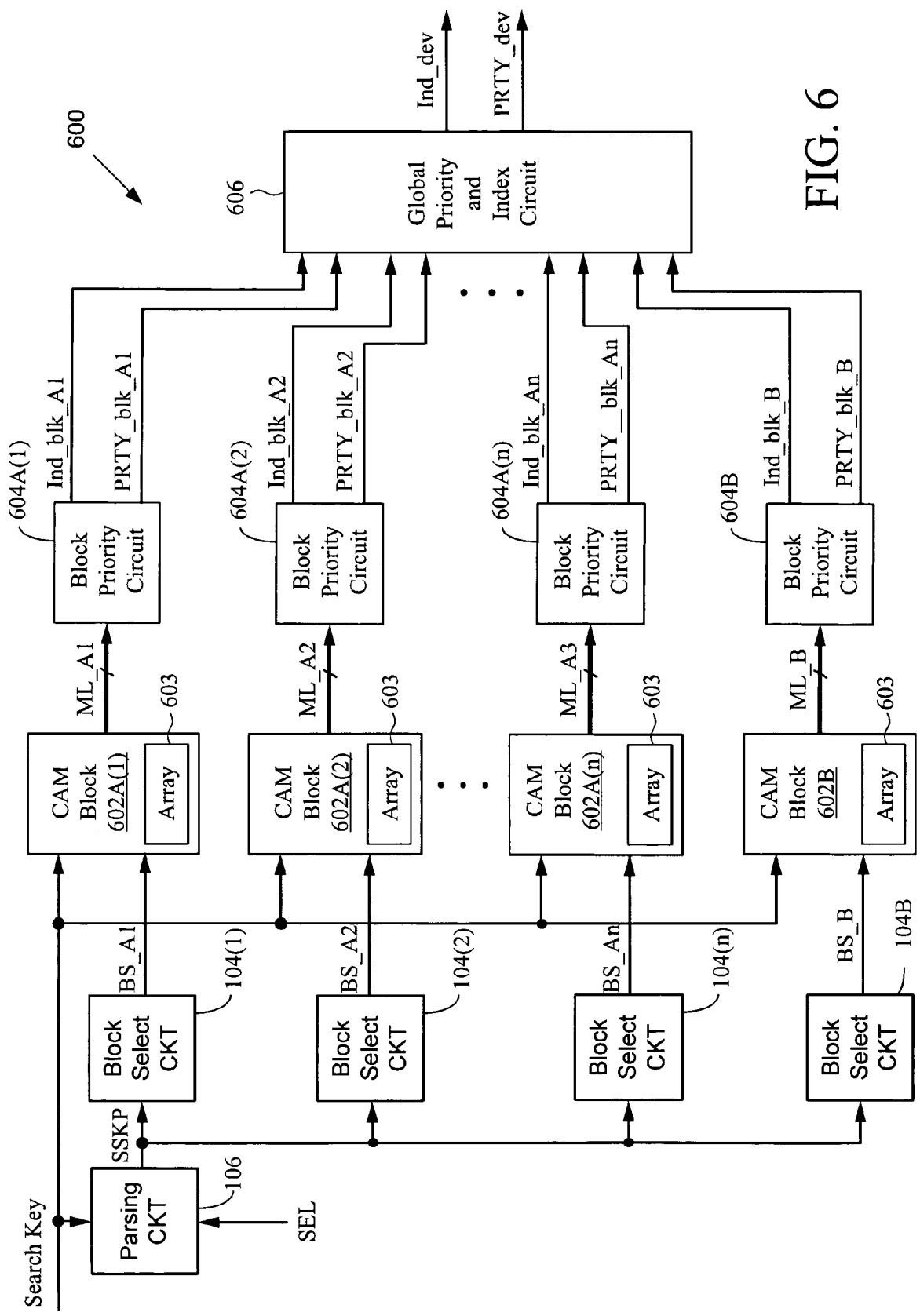
FIG. 6 is a block diagram of a modified embodiment of the CAM device of FIG. 1.

FIG. 6 shows a CAM device 600 that is a modified embodiment of the CAM device 100 of FIG. 1 that allows data values having various assigned priorities to be stored in the CAM arrays without spacing between priority groups and without having to re-order existing entries when new entries are stored. For some embodiments, the priorities associated with data values stored in CAM device 600 can be mask values that determine which bits of the data values are masked during compare operations with the search key. For one embodiment, the data values are CIDR addresses and the priorities are CIDR prefixes. For other embodiments, the priorities associated with the data values do not correspond to mask values. One or more instructions and related control signals can be provided to CAM device 600 from an instruction decoder (not shown for simplicity) to control read, write, and compare operations for CAM device 600. Other well-known signals that can be provided to CAM device 600, such as enable signals, reset signals, and clock signals, are not shown for simplicity.

CAM device 600 includes parsing circuit 106, a plurality of CAM blocks 602A(1)–602A(n) and 602B, a plurality of corresponding block select circuits 104A(1)–104A(n) and 104B, a plurality of corresponding block priority circuits 604A(1)–604A(n) and 604B, and a global priority and index circuit 606. The architecture and operation of CAM blocks 602 are similar to that of CAM blocks 102 of FIG. 1, and thus are not described in detail again. Thus, for some embodiments, CAM blocks 602 can be CAM blocks 102 of FIG. 1 and arrays 603 can be arrays 103 of FIG. 1, although other suitable CAM blocks and array architectures can be used. Further, operation of block select circuits 104 and parsing circuit 106 is described above with respect to FIGS. 1–5, and is therefore not repeated here. For other embodiments, block select circuits 104 and parsing circuit 106 can be eliminated from CAM device 600.

Each block priority circuit 604 includes inputs to receive match signals from a corresponding CAM block 602 via match lines ML (represented collectively in FIG. 6), and generates the index (Ind_blk) and assigned priority (PRTY_blk) of a highest priority data value in the corresponding CAM array 603 that matches the search key during compare operations. Global priority and index circuit 606, which includes inputs to receive the block indexes and corresponding assigned priorities generated by the block priority circuits 604, determines which of the matching data values in CAM blocks 602A(1)–602A(n) and 602B is assigned the highest priority and includes outputs to provide the index (Ind_dev) and priority (PRTY_dev) of the matching data value in CAM device 600 that is assigned the highest priority.

Each of CAM blocks 602A(1)–602A(n), which may hereinafter be referred to as regular CAM blocks, is assigned a range of data values and stores only data values that fall within its assigned range, as described above with respect to FIG. 1. For some embodiments, the data ranges assigned to regular CAM blocks 602A are unique, while for other embodiments the data ranges assigned to regular CAM blocks 602A can overlap one another. CAM block 602B, which may hereinafter be referred to as an overflow CAM block, is used to store new data entries when there is not an available storage location in the regular CAM block(s) 602A that is assigned to the new entry's data value (e.g., content) range. Thus, for some embodiments, overflow CAM block 602B is assigned a content range that includes all the content ranges of regular CAM blocks 602A. For simplicity, only one overflow CAM block 602B is shown in FIG. 6. However, in actual embodiments, CAM device 600 can include any number of overflow CAM blocks 602B. Further, although regular CAM blocks 602A are described below as being assigned a predetermined content range, for other embodiments CAM blocks 602 are not assigned content ranges.

As mentioned above, CAM device 600 is configured to store data values that are assigned various priorities. For first embodiments, the data values stored within each of the regular CAM blocks 602A(1)–602A(n) and the overflow CAM block 602B are ordered according to priority such that data values having higher assigned priorities are stored in lower physical addresses of each CAM array 603 and data values having lower assigned priorities are stored in higher physical addresses of each CAM array 603, although for other embodiments priority ordering can be reversed. For some embodiments, each CAM block 602A and 602B is divided into a plurality of array segments, where each array segment includes any number of rows of CAM cells to store data values that are assigned the same priority. Because CAM blocks 602A(1)–602A(n) store data values according to their content, multiple CAM blocks 602A and/or 602B can have array segments which store data values that are assigned the same priority. CAM blocks 602A(1)–602A(n) and 602B can be divided into any number of array segments, and each array segment can include any number of storage locations (e.g., rows of CAM cells). For some embodiments, CAM blocks 602 are divided into the same number of array segments, while for other embodiments CAM blocks 602 can be divided into different numbers of array segments.

Thus, for an exemplary first embodiment of CAM device 600, a user assigns each regular CAM block 602A a predetermined content range, divides the CAM block's array 603 into a number of array segments, and then assigns a priority to each array segment. The user also divides the array 603 of overflow CAM block 602B into a number of array segments and assigns each overflow array segment a priority. The user then loads an initial set of data values into the regular CAM blocks 602A according to content and priority so that each CAM block 602A stores data values that fall within the assigned content range and the data values within each CAM block 602A are arranged according to their assigned priority. To optimize the storage capacity of CAM device 600, the array segments of each regular CAM block 602A are sized such that the initial set of data values can be stored in regular CAM block arrays 602A without leaving any available storage locations therein. Thereafter, new data values can be stored in the overflow CAM block 602B without re-ordering the initial set of data values stored in regular CAM blocks 602A(1)–602A(n).

During compare operations with the search key, the regular CAM blocks 602A(1)–602A(n) and the overflow CAM block 602B generate match signals on match lines ML_A1–ML_An and ML_B, respectively. In response to these match signals, each block priority circuit 604 determines which matching data value (if any) in the corresponding CAM block 602 has the highest priority and outputs the block index (Ind_blk) and the priority (PTRY_blk) of the highest priority matching data value. Global priority and index circuit 606 receives the block indexes and priorities from block priority circuits 604A and 604B and determines which of the matching data values from CAM blocks 602A and 604B has the highest assigned priority and outputs the device index (Ind_dev) and the priority (PRTY_dev) of the highest priority matching data value.

Figure 7:
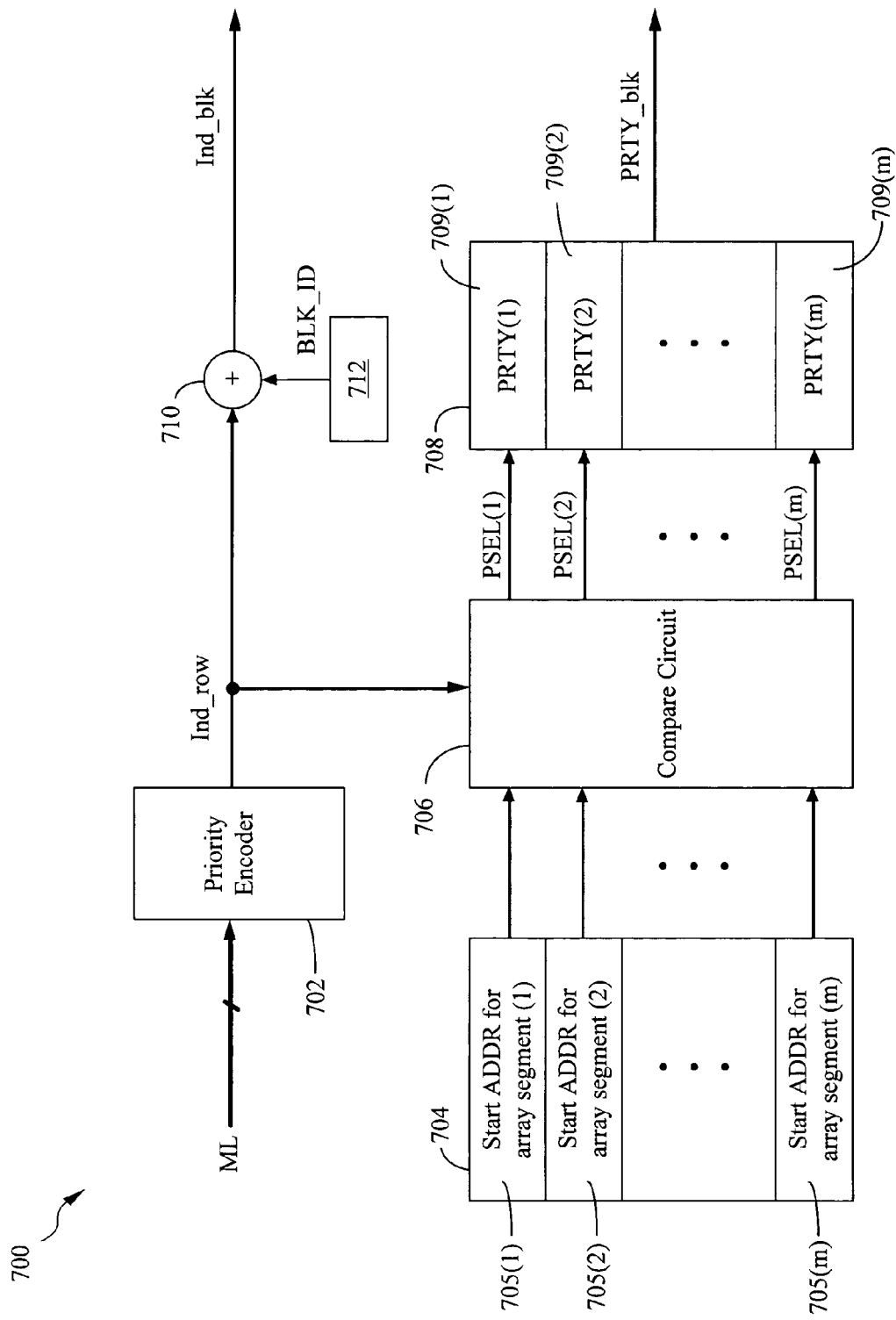
FIG. 7 is a block diagram of one embodiment of the block priority circuit of FIG. 6.

FIG. 7 shows a block priority circuit 700 that is one embodiment of block priority circuit 604 of FIG. 6. Block priority circuit 700 includes a priority encoder 702, an address table 704, a compare circuit 706, a priority table 708, a concatenation node 710, and a memory 712. Priority encoder 702 is well-known, and generates a row index (Ind_row) in response to match signals received from a corresponding CAM block 602. For some embodiments, priority encoder 702 selects the lowest row address in the corresponding array 603 that stores a matching data value to output as Ind_row, although for other embodiments priority encoder 702 can output the highest row address that stores a matching entry. Address table 704, which can be any suitable storage element such as a look-up table, register table, RAM, or PROM, includes a plurality of rows 705(1)

–705(m) each for storing the start or floor address of a corresponding array segment in the corresponding CAM block 602. Compare circuit 706 includes a plurality of first inputs to receive the start addresses from corresponding rows 705 of address table 704, a second input to receive Ind_row from priority encoder 702, and a plurality of outputs coupled to corresponding rows 709 of priority table 708. Each row 709 of priority table 708, which can be any suitable storage element such as a look-up table, register table, RAM, or PROM, stores the priority PRTY of a corresponding array segment. Priority table 708 also includes an output to provide PRTY_blk. Concatenation node 710 concatenates a block identification (BLK_ID) stored in memory element 712 as the most significant bits (MSBs) to Ind_row to generate Ind_blk. Memory 712 can be any suitable storage element such as, for example, a latch, register, memory cell, or fuse set. Note that concatenation node 710 may not be an actual circuit element, but rather represents the concatenation of Ind_row and BLK_ID to form Ind_blk.

During a set-up or initialization operation of CAM device 600, address table 704 and priority table 708 are loaded with the start addresses and priorities, respectively, of corresponding array segments in CAM array 603, and memory 712 is programmed with the appropriate block ID. For example, when a user of CAM device 600 divides array 603 into a number of array segments, the user may also program the start address for each array segment into a corresponding row 705 of address table 704, and program the priority PRTY of each array segment into a corresponding row 709 of priority table 708. Memory 712 can be programmed with the correct BLK_ID by the user or by the manufacturer of CAM device 600.

Then, during compare operations between the search key and data values stored in CAM device 600, priority encoder 702 generates Ind_row in response to match signals on ML. Compare circuit 706 compares Ind_row with the start addresses provided by address table 704 to determine in which array segment the matching data entry identified by Ind_row is stored. For example, if Ind_row is greater than or equal to the start address for array segment 1 and is less than the start address for array segment 2, then the matching entry identified by Ind_row is stored in array segment 1. In response to the comparison between Ind_row and the array segment start addresses from address table 704, compare circuit 706 asserts one of priority select signals PSEL(1)–PSEL(m), which in turn selects a corresponding priority PRTY to be output from priority table 708 as PTRY_blk. Thus, using the above example, if compare circuit 706 determines that the matching data value identified by Ind_row is stored in the first array segment, compare circuit 706 asserts PSEL(1) and de-asserts PSEL(2)–PSEL(m). The asserted state of PSEL(1) causes priority table 708 to output PRTY(1) from corresponding row 709(1) as PRTY_blk.

For other embodiments, each row 705 of address table 704 can store an address range for a corresponding array segment in the associated CAM array 603. For such embodiments, compare circuit 706 compares Ind_row with each address range stored in address table 704 to determine in which array segment the matching data value identified by Ind_row is stored.

Figure 8:
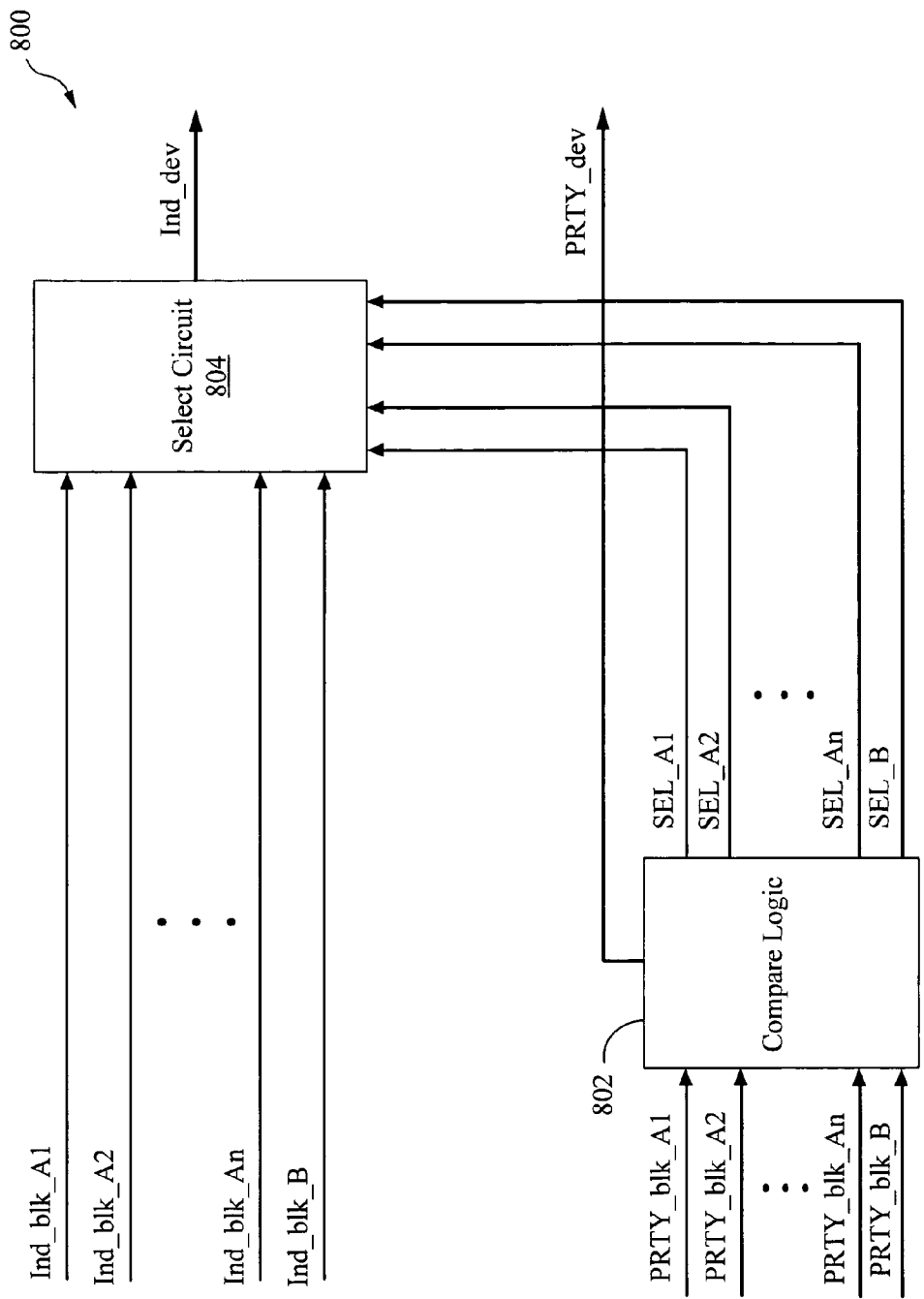
FIG. 8 is a block diagram of one embodiment of the global priority and index circuit of FIG. 6.

FIG. 8 shows a global priority and index circuit 800 that is one embodiment of global priority and index circuit 606 of FIG. 6. Circuit 800 includes compare logic 802 and a select circuit 804. Compare logic 802 includes inputs to receive PRTY_blk_A1 to PRTY_blk_An and PRTY_blk_B from block priority circuits 604A(1)–604A(n) and 604B, respectively, a plurality of first outputs to generate corresponding select signals SEL_A1 to SEL_An and SEL_B, and a second output to provide PRTY_dev. Select circuit 804 includes first inputs to receives the block indexes Ind_blk_A1 to Ind_blk_An and Ind_blk_B from corresponding CAM blocks 602, select inputs to receive select signals SEL_A1 to SEL_An and SEL_B, and an output to generate Ind_dev.

During compare operations between the search key and data values stored in CAM blocks 602 of FIG. 6, compare logic 802 compares the block priorities with each other to determine which block priority is the highest (e.g., which PRTY_blk has the lowest numerical value), and in response thereto outputs the highest priority block index as PRTY_dev, asserts a corresponding select signal SEL, and de-asserts the other select signals. In response to the asserted select signal SEL, select circuit 804 outputs the corresponding block index as Ind_dev. For example, if compare logic 802 determines that PRTY_blk_A1 is the highest priority, compare logic 802 outputs PRTY_blk_A1 as PRTY_dev, asserts SEL_A1, and de-asserts SEL_A2 to SEL_An and SEL_B. The asserted state of SEL_A1 causes select circuit 804 to output Ind_blk_A1 as Ind_dev. If compare logic 802 determines that more than one block priority is the highest (e.g., that more than one PRTY_blk has the same lowest numerical value), compare logic 802 selects one of the block priorities as the highest priority and asserts the corresponding select signal. For some embodiments, compare circuit 802 resolves priority between multiple block priorities having the same value based upon a predetermined priority ordering. For other embodiments, compare logic 802 can include a priority encoder (not shown for simplicity) to resolve priority.

Figure 9:
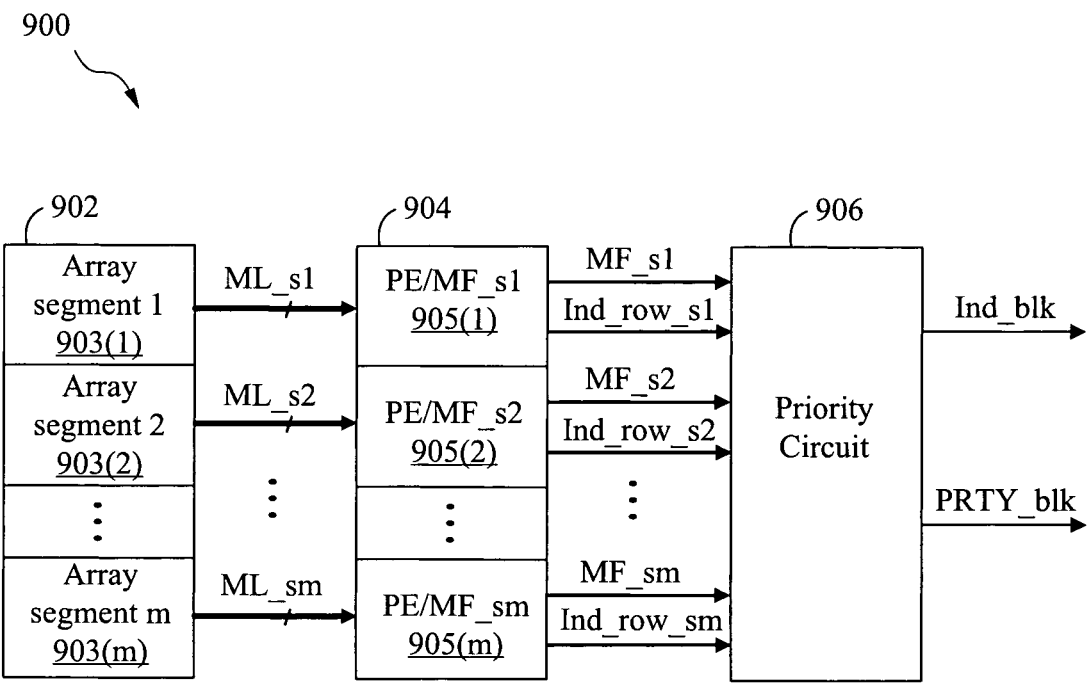
FIG. 9 is a block diagram of a modified embodiment of the CAM block of FIG. 6.

For second embodiments of the present invention, the groups of data values stored in corresponding array segments of each CAM block 602A and/or 602B are not ordered according to priority. Thus, although each array segment stores data values that are assigned the same priority PRTY, any array segment can be assigned any priority. For example, FIG. 9 shows a portion of a CAM device 900 that is a modified embodiment of CAM device 600 of FIG. 6. CAM portion 900 is shown to include a segmented CAM array 902, a segmented block priority encoder and match flag circuit 904, and a priority circuit 906. CAM array 902 includes a plurality of array segments 903(1)–903(m), each including any number of rows of CAM cells for storing data values that have the same priority. The architecture and segmenting of CAM array 902 is similar to that described above with respect to CAM array 603 of CAM device 600, and are thus not described in detail again.

Priority encoder and match flag (PE/MF) circuit 904 is divided into a plurality of segments 905(1)–905(m), each of which includes inputs to receive match signals via ML from a corresponding array segment 903 and includes outputs to generate a match flag (MF_s) and the row index (Ind_row_s) for the corresponding array segment. Each PE/MF segment 905 generates MF_s and Ind_row_s in response to the match signals on a corresponding ML_s in a well-known manner. For some embodiments, each PE/MF segment 905 selects the lowest address in the corresponding array segment 903 that stores a matching entry to output as Ind_row, although for other embodiment PE/MF segment 905 can output the highest address that stores a matching entry as Ind_row. Further, although PE/MF circuit 904 is shown in FIG. 9 as a single circuit element, for some embodiments each PE/MF segment 905 can be a separate circuit element. Priority circuit 906, which includes inputs to receive the segment match flags and segment row indexes from PE/MF circuit 904, determines which matching entry stored in CAM array 902 is assigned the highest priority PRTY, and in response thereto generates Ind_blk and PRTY_blk. Note that PE/MF circuit 904 and priority circuit 906 are one embodiment of the block priority circuit 604 of FIG. 6.

Figure 10:
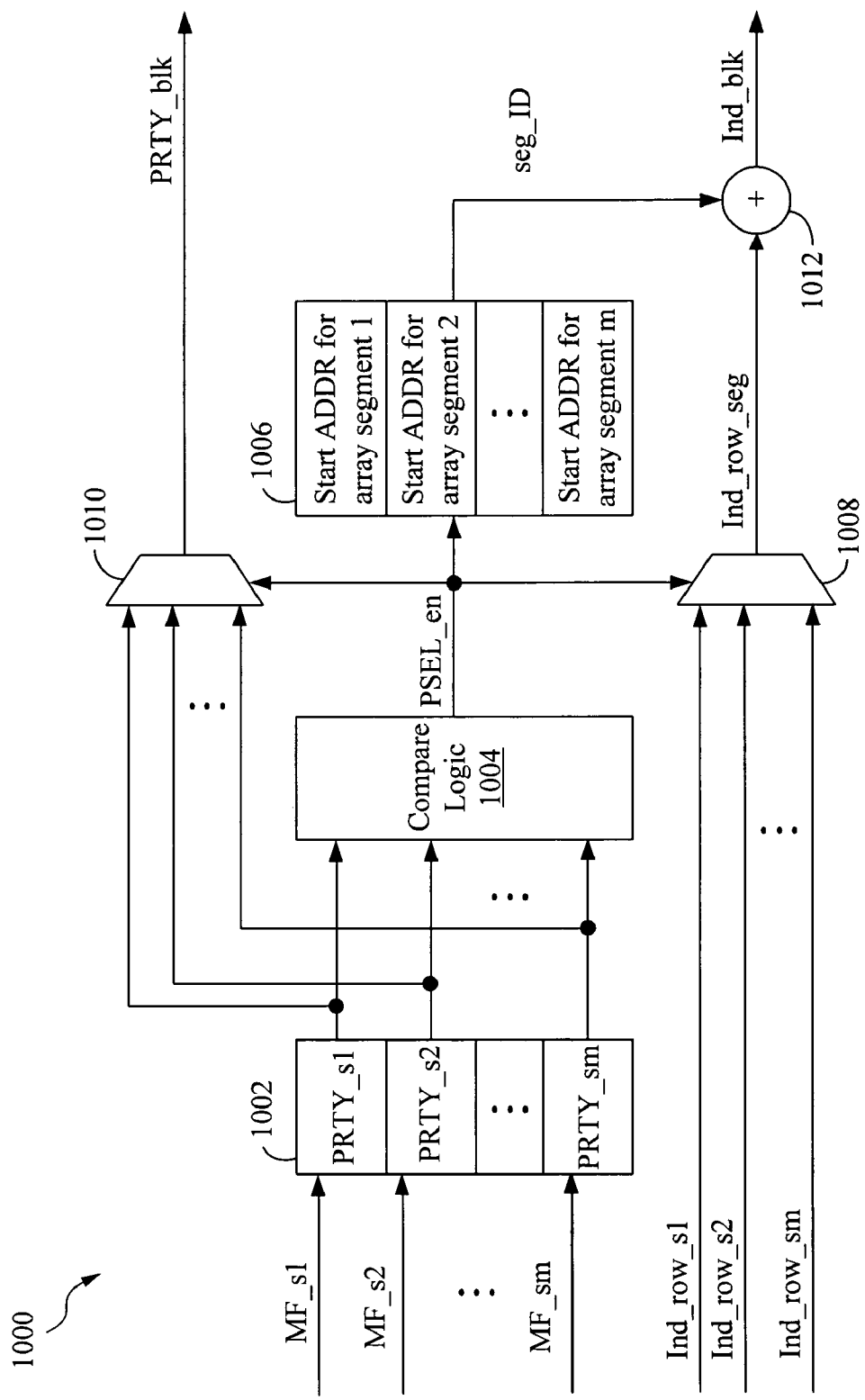
FIG. 10 is a block diagram of one embodiment of the block priority circuit of FIG. 9.

FIG. 10 shows a priority circuit 1000 that is one embodiment of priority circuit 906 of FIG. 9. Priority circuit 1000 includes a priority table 1002, compare logic 1004, an address table 1006, multiplexers 1008 and 1010, and a concatenation node 1012. Priority table 1002 includes a plurality of rows, each for storing the priority PRTY of a corresponding array segment 903 and having an input to receive a corresponding segment match flag MF_s from PE/MF circuit 904. Priority table 1002, which can be any suitable storage element such as a look-up table, register table, RAM, or PROM, includes outputs to selectively provide PRTY_s1 to PRTY_sm to corresponding inputs of compare logic 1004 and multiplexer 1010 in response to MF_s1 to MF_sm, respectively. Multiplexer 1010 includes an output to generate PRTY_blk. Compare logic 1004 compares the priorities selectively provided by priority table 1002 with each other to determine which priority is the highest (e.g., which PRTY has the lowest numerical value), and provides the highest PRTY as an encoded priority select signal PSEL_en to address table 1006 and to the control terminals of multiplexers 1008 and 1010.

Address table 1006, which can be any suitable storage element such as a look-up table, register table, RAM, or PROM, includes a plurality of rows, each for storing the start or floor address for a corresponding array segment 903 in CAM array 902. In response to PSEL_en, address table 1006 outputs the start address of the array segment 903 that stores the matching entry that has the highest PRTY as seg_ID. Multiplexer 1008 includes a plurality of inputs to receive Ind_row_s1 to Ind_row_sm from PE/MF circuit 904, and includes an output to generate Ind_row_seg. Concatenation node 1012 concatenates seg_ID as the MSBs to Ind_row_seg to generate Ind_blk. Note that concatenation node 1012 is not an actual circuit element, but rather is representative of the concatenation of Ind_row_seg and seg_ID to form Ind_blk.

During a set-up or initialization operation, address table 1006 and priority table 1002 are loaded with the start addresses and priorities, respectively, of segmented CAM array 902 as described above, for example, with respect to address table 704 and priority table 708 of FIG. 7. Then, during compare operations between the search key and data values stored in CAM device 900, each segment 905 of PE/MF circuit 904 generates Ind_row_s and MF_s in response to match signals on the corresponding match lines ML_s. For each asserted match flag segment MF_s, priority table 1002 forwards the PRTY of the corresponding array segment 903 to compare logic 1004 and to multiplexer 1010. Compare logic 1004 determines which PRTY is the highest, and outputs the highest PRTY as an encoded priority select signal PSEL_en to address table 1006 and to multiplexers 1008 and 1010. For example, for embodiments in which CAM array 902 includes 16 array segments 903(1)–903(16) each having a different PRTY, priority table 1002 can store 4-bit priority values indicative of PRTY(1)–PTRY(16), and compare logic 1004 can be a 4-bit compare logic that outputs a 4-bit encoded select signal PSEL_en indicative of the highest PRTY that has a matching entry. In response to PSEL_en, multiplexer 1010 outputs the corresponding highest priority PRTY_s as PRTY_blk, multiplexer 1008 outputs the segment row index Ind_s corresponding to the highest PRTY as Ind_row_seg, and address table 1006 outputs the start address of the corresponding array segment 903 as seg_ID. Then, seg_ID and Ind_row_seg are concatenated to generate Ind_blk. Thereafter, the block indexes and corresponding priorities from multiple CAM arrays 902 can be combined in a global priority and index circuit (e.g., circuit 606 of FIG. 6) to generate PRTY_dev and Ind_dev in the manner described above with respect to FIGS. 6–8.

Figure 11:
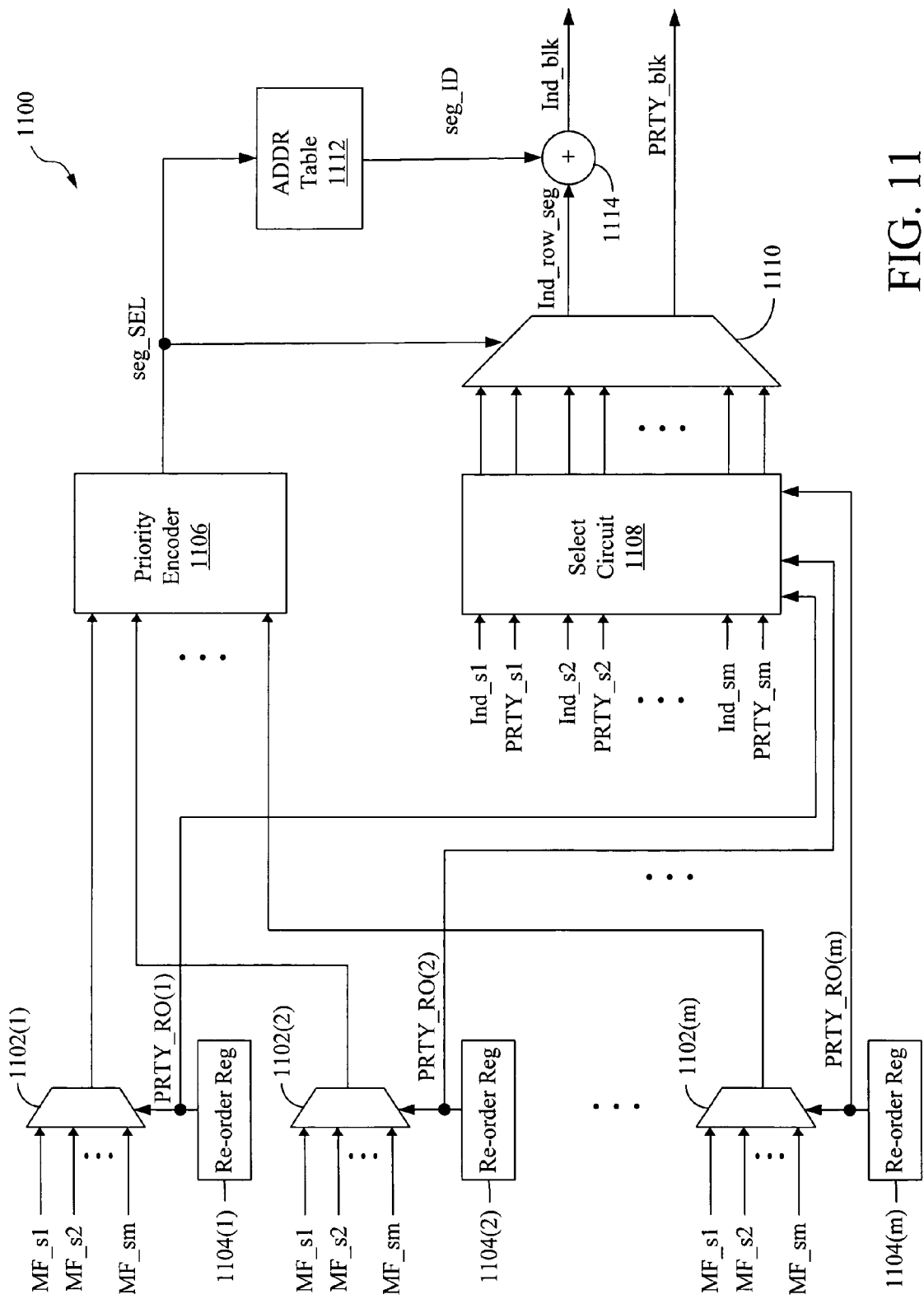
FIG. 11 is a block diagram of another embodiment of the block priority circuit of FIG. 9.

FIG. 11 shows a priority circuit 1100 that is another embodiment of priority circuit 906 of FIG. 9. Priority circuit 1100 includes a plurality of multiplexers 1102(1)–1102(m) and corresponding re-order registers 1104(1)–1104(m), a priority encoder 1106, a select circuit 1108, a multiplexer 1110, an address table 1112, and a concatenation node 1114. Each multiplexer 1102 corresponds to a priority PRTY assigned to one of array segments 903 of CAM array 902, and includes inputs to receive the segment match flags MF_s1 to MF_sm from CAM array 902, a control terminal coupled to a corresponding re-order register 1104, and an output connected to a corresponding input of priority encoder 1106. Priority encoder 1106 is well-known, and includes an output connected to the control terminal of multiplexer 1110 and to address table 1112. Select circuit 1108 includes inputs to receive the segment index Ind_s and priority PRTY_s from each array segment 903 in CAM array 902, control terminals coupled to the outputs of re-order registers 1104(1)–1104(m), and outputs connected to corresponding inputs of multiplexer 1110, which in turn includes outputs to generate Ind_row_seg and PRTY_blk. Address table 1112, which can be any suitable storage element such as a look-up table, register table, RAM, or PROM, includes a plurality of rows, each for storing the start or floor address for a corresponding array segment 903 in CAM array 902. Address table 1112 also includes an output to generate the start address of the array segment 903 that stores the matching entry that has the highest PRTY as seg_ID. Concatenation node 1114 concatenates seg_ID as the MSBs to Ind_row_seg to generate Ind_blk. Note that concatenation node 1114 is not an actual circuit element, but rather is representative of the concatenation of Ind_row_seg and seg_ID to form Ind_blk.

Each re-order register 1104 stores a priority re-order value PRTY_RO that re-orders the segment match flags MF_s1 to MF_sm provided to priority encoder 1106 according to PRTY. For example, if array segment 903(1) has a PRTY_s1=2 and array segment 903(2) has a PRTY_s2=1, (e.g., PRTY_s2 is higher than PRTY_s1), then re-order register 1104(1) stores a PRTY_RO that causes multiplexer 1102(1) to output MF_s2 to the first (e.g., highest priority) input of priority encoder 1106 and re-order register 1104(2) stores a PRTY_RO that causes multiplexer 1102(2) to output MF_s1 to the second (e.g., the next highest priority) input of priority encoder 1106, thereby re-ordering the segment match flags provided to priority encoder 1106 according to assigned priority PRTY. In response thereto, priority encoder 1106 generates a segment select signal (seg_SEL) that selects which segment index Ind_s and priority PRTY multiplexer 1110 outputs as Ind_row-seg and PRTY_blk, respectively.

Select circuit 1108 re-orders the segment indexes and segment priorities in response to PRTY_RO(1) to PRTY_RO(m) according to PRTY in a manner similar to that of multiplexers 1102(1)–1102(m) so that the segment index and associated priority corresponding to the array segment 903 having the highest PRTY is provided to the first input of multiplexer 1110, the segment index and associated priority corresponding to the array segment 903 having the next-highest PRTY is provided to the second input of multiplexer 1110, and so on, where the segment index and associated priority corresponding to the array segment 903 having the lowest PRTY is provided to the last input of multiplexer 1110. Thus, for some embodiments, select circuit 1108 includes first and second sets of multiplexers (not shown for simplicity), where each of the first set of multiplexers includes inputs to receive Ind_s1 to Ind_sm, a control terminal to receive a corresponding PRTY_RO signal, and an output connected to a corresponding input of multiplexer 1110, and each of the second set of multiplexers includes inputs to receive PRTY_s1 to PRTY_sm, a control terminal to receive a corresponding PRTY_RO signal, and an output connected to a corresponding input of multiplexer 1110. In this manner, the segment select signal seg_SEL generated by priority encoder 1106 causes multiplexer 1110 to output the segment index and PRTY from the array segment 903 that has the highest PRTY.

Figure 12:
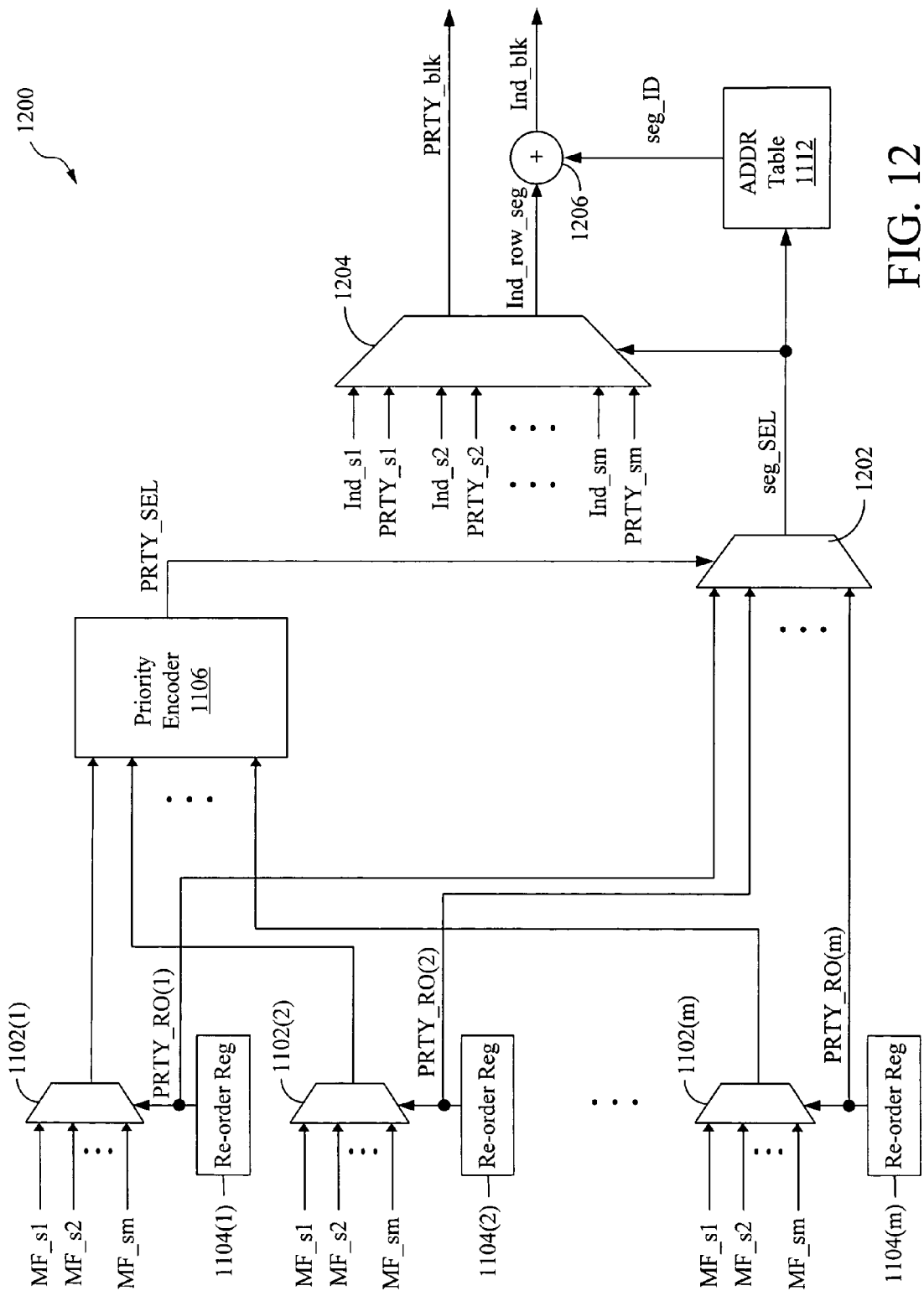
FIG. 12 is a block diagram of yet another embodiment of the block priority circuit of FIG. 9.

FIG. 12 shows a priority circuit 1200 that is yet another embodiment of priority circuit 906 of FIG. 9. Priority circuit 1200 includes the plurality of multiplexers 1102(1)–1102(m), corresponding re-order registers 1104(1)–1104(m), priority encoder 1106, and address table 1112 of FIG. 11, and also includes a first multiplexer 1202, a second multiplexer 1204, and a concatenation node 1206. As described above with respect to FIG. 11, each multiplexer 1102 corresponds to a priority PRTY assigned to one of array segments 903 of CAM array 902, and includes inputs to receive the segment match flags MF_s1 to MF_sm from CAM array 902, a control terminal coupled to a corresponding re-order register 1104, and an output connected to a corresponding input of priority encoder 1106. Each re-order register 1104 stores a priority re-order value PRTY_RO that re-orders the segment match flags MF_s1 to MF_sm provided to priority encoder 1106 according to PRTY, as described above with respect to FIG. 11. Priority encoder 1106 is well-known, and includes an output connected to the control terminal of multiplexer 1202, which includes inputs to receive the priority re-order values PRTY_RO from corresponding re-order registers 1104 and an output to generate seg_SEL. Multiplexer 1204 includes inputs to receive the segment index Ind_s and priority PRTY_s from each array segment 903 in CAM array 902, a control terminal to receive seg_SEL, and outputs to generate Ind_row_seg and PRTY_blk. Address table 1112 generates the start address of the array segment 903 that stores the matching entry that has the highest PRTY as seg_ID in response to seg_SEL. Concatenation node 1206 concatenates seg_ID as the MSBs to Ind_row_seg to generate Ind_blk. Note that concatenation node 1206 is not an actual circuit element, but rather is representative of the concatenation of Ind_row_seg and seg_ID to form Ind_blk.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A content addressable memory (CAM) device for comparing a search key to data values stored therein, comprising:
a plurality of CAM blocks, each CAM block including an array of CAM cells divided into a plurality of segments, each array segment for storing a number of data values that are assigned the same priority; and
a plurality of block priority circuits, each having inputs to receive match signals from a corresponding CAM block, outputs to generate a block index and the priority of a matching data value, and an address table for storing address information for each array segment in the corresponding CAM block.

2. The CAM device of claim 1, wherein each CAM block is assigned to store a predetermined content range of data values.

3. The CAM device of claim 1, further comprising an overflow CAM block that can store any data value, regardless of content.

4. The CAM device of claim 1, further comprising:
means for extracting a selected portion of the search key in response to a select signal; and
means for selectively enabling each CAM block in response to a comparison between the selected portion of the search key and the predetermined range of data values for the corresponding CAM block.

5. The CAM device of claim 1, wherein the address information comprises a start address for each array segment.

6. The CAM device of claim 1, wherein the address information comprises an address range for each array segment.

7. The CAM device of claim 1, wherein each block priority circuit compares the block index with the address information to determine the priority assigned to the matching data value.

8. The CAM device of claim 1, wherein each block priority circuit further comprises:
a priority encoder having inputs to receive the match signals from the corresponding CAM block and having an output to generate a row index of the matching data value;
a compare circuit having first inputs to receive the address information, a second input to receive the row index, and a plurality of outputs; and
a priority table having a plurality of rows, each for storing the priority assigned to a corresponding array segment and having an input coupled to a corresponding output of the compare circuit, the priority table having an output to generate the priority of the matching data value.

9. The CAM device of claim 8, wherein the compare circuit compares the row index with the address information to selectively enable one of the rows of the priority table.

10. The CAM device of claim 9, wherein the compare circuit asserts one of a plurality of priority select signals in response to the comparison between the row index and the address information.

11. The CAM device of claim 8, wherein each block priority circuit further comprises:
a memory to store a block identification (ID) for the corresponding CAM block; and
means for concatenating the block ID to the row index to generate the block index.

12. The CAM device of claim 1, further comprising:
a global priority and index circuit having inputs to receive the block indexes and priorities from the block priority circuits, and having an output to generate a device index of the highest priority matching data value.

13. The CAM device of claim 12, wherein the global priority and index circuit comprises:
compare logic having inputs to receive the priorities from the block priority circuits and having outputs to generate select signals for corresponding CAM blocks; and a select circuit having first inputs to receive the block indexes, second inputs to receive the select signals, and an output to generate the device index.

14. The CAM device of claim 13, wherein the select circuit selectively outputs one of the block indexes as the device index in response to the select signals.

15. The CAM device of claim 13, wherein the compare logic compares the priorities with each other to determine which priority is the highest.

16. The CAM device of claim 15, wherein the compare logic includes a second output to generate the highest priority.

17. The CAM device of claim 1, wherein each block priority circuit comprises:
a priority encoder and match flag circuit having a plurality of segments, each segment including inputs to receive the match signals from a corresponding array segment and having outputs to generate a row index and a segment match flag for the corresponding array segment; and
a priority circuit having inputs to receive the row indexes and segment match flags and having outputs to generate a device index and priority of a highest priority matching data value.

18. The CAM device of claim 17, wherein the priority circuit is configured to re-order the row indexes and match flags according to priority.

19. The CAM device of claim 17, wherein the priority circuit further comprises:
means for storing the priority assigned to each array segment.

20. The CAM device of claim 17, wherein the priority circuit further comprises:
a priority table having a plurality of rows each for storing the priority assigned to a corresponding array segment;
compare logic having a plurality of inputs to receive the priorities from the priority table and having an output;
a first multiplexer having a plurality of inputs to receive the priorities from the priority table, an output to generate a block priority, and a control terminal coupled to the output of the compare logic; and
a second multiplexer having a plurality of inputs each to receive the row index from a corresponding array segment, a control terminal coupled to the output of the compare logic, and an output to selectively output one of the row indexes.

21. The CAM device of claim 20, wherein each row of the priority table is responsive to a corresponding segment match flag.

22. The CAM device of claim 17, wherein the priority circuit further comprises:
a plurality of first multiplexers, each having inputs to receive the segment match flags from the corresponding CAM block;
a plurality of re-order registers, each having an output coupled to a control terminal of a corresponding first multiplexer;
a priority encoder having a plurality of inputs, each coupled to an output of a corresponding first multiplexer;
a select circuit having a plurality of inputs to receive the row indexes and associated priorities from the corresponding CAM block, and having a plurality of control terminals each coupled to the output of a corresponding re-order register; and
a second multiplexer having a plurality of inputs coupled to corresponding outputs of the select circuit, a control terminal coupled to an output of the priority encoder, and outputs to generate the row index and priority of the matching data value that has the highest assigned priority.

23. The CAM device of claim 17, wherein the priority circuit further comprises:
a plurality of first multiplexers, each having inputs to receive the segment match flags from the corresponding CAM block;
a plurality of re-order registers, each having an output coupled to a control terminal of a corresponding first multiplexer;
a priority encoder having a plurality of inputs, each coupled to an output of a corresponding first multiplexer;
a second multiplexer having a plurality of inputs coupled to the outputs of corresponding re-order registers, and a control terminal coupled to the output of the priority encoder; and
a third multiplexer having a plurality of input pairs, each for receiving the row indexes and priorities from the corresponding CAM block, and having a control terminal coupled to an output of the second multiplexer, and having outputs to generate the row index and priority of the matching data value that has the highest assigned priority.

24. A content addressable memory (CAM) device having a plurality of CAM blocks, each comprising:
an array of CAM cells divided into a plurality of segments, each array segment for storing a number of data values that are assigned the same priority;
means for generating a row index of a highest priority matching value;
means for storing address information for each array segment, wherein the means for storing comprises an address table; and
means for comparing the row index with the address information to determine which priority the matching data value is assigned.

25. The CAM device of claim 24, wherein each CAM block is assigned to store a unique range of data values.

26. The CAM device of claim 24, further comprising:
means for extracting a selected portion of a search key; and
means for selectively enabling each CAM block in response to a comparison between the selected portion of the search key and the assigned range of data values for the corresponding CAM block.

27. The CAM device of claim 24, wherein the address information comprises a start address for each array segment.

28. The CAM device of claim 24, wherein the address information comprises an address range for each array segment.

29. The CAM device of claim 24, wherein the means for generating and the means for comparing comprises a priority circuit.

30. The CAM device of claim 29, wherein the priority circuit comprises the address table, the address table having a plurality of rows, each for storing address information for a corresponding array segment.

31. The CAM device of claim 30, wherein the means for comparing further comprises a compare circuit having first inputs to receive the address information from the address table, a second input to receive the row index, and outputs to generate a priority select signal for each array segment.

32. The CAM device of claim 31, wherein each CAM block further comprises:
  a priority table having a plurality of rows, each for storing the priority assigned to a corresponding array segment and each responsive to a corresponding priority select signal.

33. The CAM device of claim 32, wherein each CAM block further comprises:
  means for storing the priorities assigned to each of the array segments.

34. The CAM device of claim 24, wherein each CAM block further comprises:
  means for re-ordering the priorities of the array segments.

35. The CAM device of claim 34, wherein the means for re-ordering comprises a plurality of re-order registers, each for storing a re-order value.

36. A method of operating a content addressable memory (CAM) device having an array of CAM cells divided into a plurality of array segments, comprising:
  assigning a different priority to each of the array segments, wherein data values stored within the same array segment are assigned the same priority;
  storing address information for each array segment in an address table;
  generating a row index of a matching data value stored in the array; and
  comparing the row index with the address information to determine the priority of the matching data value.

37. The method of claim 36, wherein the address information comprises a start address for each array segment.

38. The method of claim 36, wherein the address information comprises an address range for each array segment.

39. The method of claim 36, further comprising:
  storing the priorities assigned to the array segments in a priority table.

40. A method of operating a content addressable memory (CAM) device having an array of CAM cells divided into a plurality of array segments, comprising:
  assigning a different priority to each of the array segments, wherein data values stored within the same array segment are assigned the same priority;
  storing address information for each array segment in an address table;
  generating a segment match flag and a row index of a matching data value stored in each array segment; and
  comparing the row indexes with the address information to determine the priorities of the matching data values.

41. The method of claim 40, further comprising:
  re-ordering the row indexes and segment match flags according to their assigned priorities.

* * * * *

UNITED STATES PATENT AND TRADEMARK OFFICE
CERTIFICATE OF CORRECTION

PATENT NO.         : 7,219,188 B1
APPLICATION NO. : 10/773591
DATED                  : May 15, 2007
INVENTOR(S)        : Jose P. Pereira It is certified that error appears in the above-identified patent and that said Letters Patent is hereby corrected as shown below:

Claim 24, Column 18, Line 33,
      replace "index of a highest priority" with --index of a--.

Signed and Sealed this

Fourteenth Day of August, 2007

JON W. DUDAS
*Director of the United States Patent and Trademark Office*